(12) United States Patent  
Köhler

(10) Patent No.: US 6,392,389 B1  
(45) Date of Patent: May 21, 2002

(54) METHOD FOR MONITORING AND CONTROLLING THE CHARGING OF GASTIGHT ALKALINE RECHARGEABLE BATTERIES

(75) Inventor: Uwe Köhler, Kassel (DE)

(73) Assignee: NBT GmbH (DE)

( * ) Notice: Subject to any disclaimer, the term of this patent is extended or adjusted under 35 U.S.C. 154(b) by 0 days.

(21) Appl. No.: 09/942,231

(22) Filed: Aug. 29, 2001

(30) Foreign Application Priority Data

Sep. 15, 2000 (DE) .......................................... 100 45 622

(51) Int. Cl.$^7$ ................................................. H02J 7/04
(52) U.S. Cl. ........................................ 320/152; 320/150
(58) Field of Search .............................. 320/152, 150, 320/160, 157, 159, 162; 429/206

(56) References Cited

U.S. PATENT DOCUMENTS 6,077,626 A * 6/2000 Nogami et al. ............. 429/223

* cited by examiner

Primary Examiner—Peter S. Wong  
Assistant Examiner—Lawrence Luk  
(74) Attorney, Agent, or Firm—Schnader Harrison; Segal & Lewis LLP

(57) ABSTRACT

In a method for monitoring the charging of gastight alkaline rechargeable batteries, the characteristics of the critical charging voltage ($U_{crit}$) on a rechargeable battery are determined as a function of the charging current (I) for various temperatures (T) and are linearized by means of a function in the form $A(I) \times T + B(I)$. The value pairs A and B are stored as parameter arrays in a battery management system, and during operation of a physically identical rechargeable battery which is to be monitored, the associated critical charging voltage is calculated by measuring the temperature and charging current and is used to control the charging of the rechargeable battery. On reaching the critical charging voltage ($U_{crit}$) which corresponds to the critical state of charge ($LZ_{crit}$), the value of the critical state of charge can be calculated by measuring the current (I) and temperature (T).

5 Claims, 4 Drawing Sheets

METHOD FOR MONITORING AND CONTROLLING THE CHARGING OF GASTIGHT ALKALINE RECHARGEABLE BATTERIES

FIELD OF THE INVENTION

This invention relates to a method of monitoring and controlling the charging of gastight alkaline rechargeable batteries and determining critical states of charge, particularly to a method that can monitor charging based on voltage and temperature.

BACKGROUND

Rechargeable alkaline battery systems are used in large quantities for modern equipment applications. In addition to these applications, they will also be increasingly used in the future in vehicles, both as a propulsion battery in hybrid vehicles and as batteries for vehicle power supply systems. High power output and the capability of feeding electrical energy back at high power effectively are essential characteristics of alkaline systems.

Of the alkaline secondary systems: nickel cadmium (NiCd), nickel metal hydride (NiMH), nickel zinc (NiZn), and nickel iron (NiFe), the nickel metal hydride system has been found to be the system having the best characteristics. In comparison with other alkaline secondary systems, it has a better charge capacity, longer life and avoids the feared "memory effect". In addition, it does not make use of toxic heavy metals.

The capabilities for rapid charging of alkaline secondary systems extend down to the range of a few minutes. Rapid charging is limited by critical cell voltages being exceeded, which are governed by the decomposition voltage of the water and oxygen gassing at the positive electrode, whose capacitance with respect to the negative electrode is under-dimensioned in a gastight alkaline cell. Oxygen gassing at the positive electrode takes place as a parasitic reaction when the positive electrode is approaching the fully charged state, and is the reason why it is necessary to limit the charging current.

The oxygen gassing reaction can result in pressure building up in the cell which, in the worst case, leads to safety valves operating and to charging gases and electrolyte escaping. Since both can have a negative effect on the life expectancy of the gastight cells, it is desirable to identify such critical states of charge at an early stage, and to limit or cut off the charging currents in good time.

However, identification of the critical states of charge is problematic. A pressure measurement is regarded as being too complex. Only the cell voltage and temperature are available as variables which can be measured from outside the cell. Since oxygen gassing reactions in gastight alkaline secondary systems are accompanied by an exothermal oxygen dissipation reaction at the negative, opposing electrode, the rate of temperature rise, which is normally observed, is in general also a signal of the start of gassing and, thus, that the pressure inside the cell is rising. However, particularly with very high charging currents, the temperature signal can be used only to a limited extent since the high thermal capacity of aqueous battery systems leads to the temperature rising only relatively slowly as a consequence of the onset of overcharging.

Thus, it would be highly advantageous to provide a method for monitoring the charging and determining critical states of charge, in which only the voltage and temperature of the rechargeable battery to be monitored are measured and are used for assessment.

SUMMARY OF THE INVENTION

This invention relates to a method of controlling charging of a gastight alkaline rechargeable battery including determining characteristics of critical charging voltage ($U_{crit}$) of the rechargeable battery as a function of charging current (I) at selected temperatures (T), linearizing the critical charging voltage according to the follow formula: $U_{crit}=A(I)\times T+B(I)$, wherein $A=\Delta U_{crit}/T/V$ and $B=U_{crit}$ at 0° C./V, and wherein A and B are stored as parameter arrays in a battery management system containing a substantially physically identical rechargeable battery, calculating an associated critical charging voltage in the substantially physically identical rechargeable battery by measuring temperature and charging current, and comparing associated critical charging voltage information with the critical charging voltage of the rechargeable battery to control the charging of the rechargeable battery.

DETAILED DESCRIPTION

The method according to the invention will be explained in more detail in the following text with reference to FIGS. 1 to 6.

Figure 1:
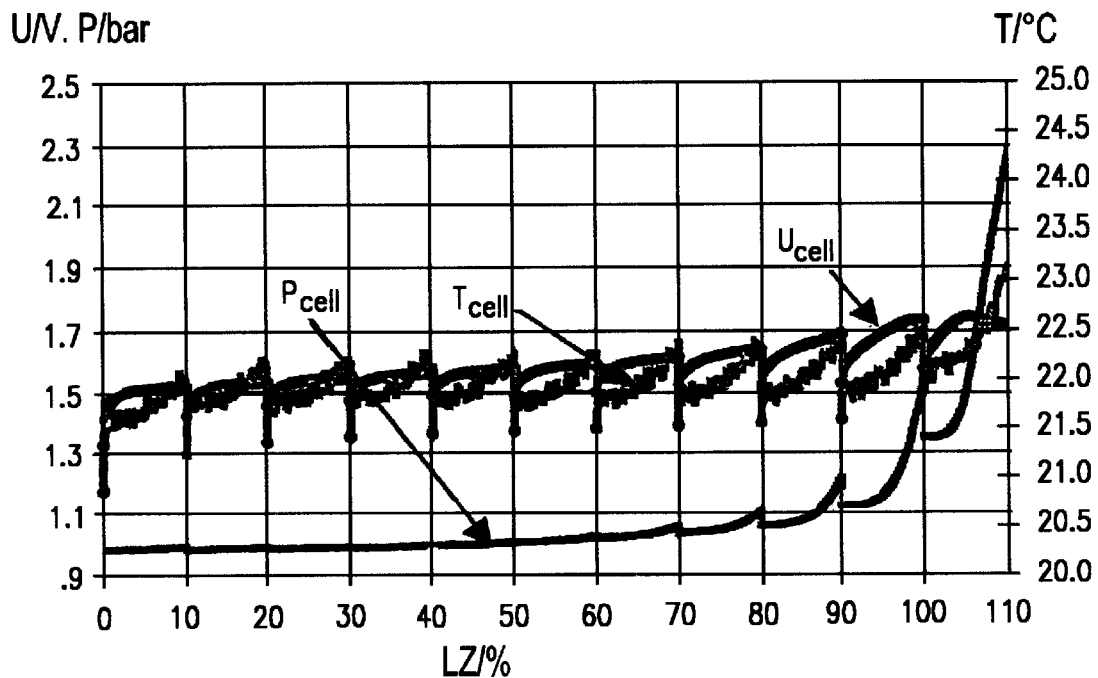
FIG. 1 is a graph showing the voltage profile $U_{CELL}$, pressure response $P_{CELL}$ and temperature profile $T_{CELL}$ of an NiMH cell.

FIG. 1 shows the voltage profile $U_{CELL}$, the pressure response $P_{CELL}$ and the temperature profile $T_{CELL}$ of an NiMH cell with a rated capacity of 9 Ah, which is charged in steps comprising 0.9 Ah charging pulses (10% of the capacity) at 20° C. at a current level of 90 A (10 C rate). After completion of each individual charging step, the cell remains at rest for 30 minutes to allow the temperature to equalize with the environment, and to bring the cell back to the rest potential, temperature and pressure. If a 90% state of charge is exceeded in the described example, a considerable pressure rise can be observed, which is associated with the voltage signal $U_{CELL}$ tending to the horizontal. On further charging, the voltage may even decrease slightly, with a further pressure rise. This effect is known as a "negative delta U-shift" (depolarization) and is now widely used as a switch-off signal, although the charging currents generally remain below the half-hour rated current (2 C rate).

Here and in the following text, the load currents on the rechargeable battery are quoted in C, that is to say, a charging current of 1 C corresponds to a rechargeable battery with a rated capacity of 9 Ah being charged with a charging current of 9 A, and charging at 10 C means a charging current of 90 A.

The value of the voltage maximum which correlates with the pressure rise caused by oxygen gassing and the gas dissipation mechanism at the negative electrode is referred to as the "critical voltage magnitude" $U_{crit}$.

Figure 2:
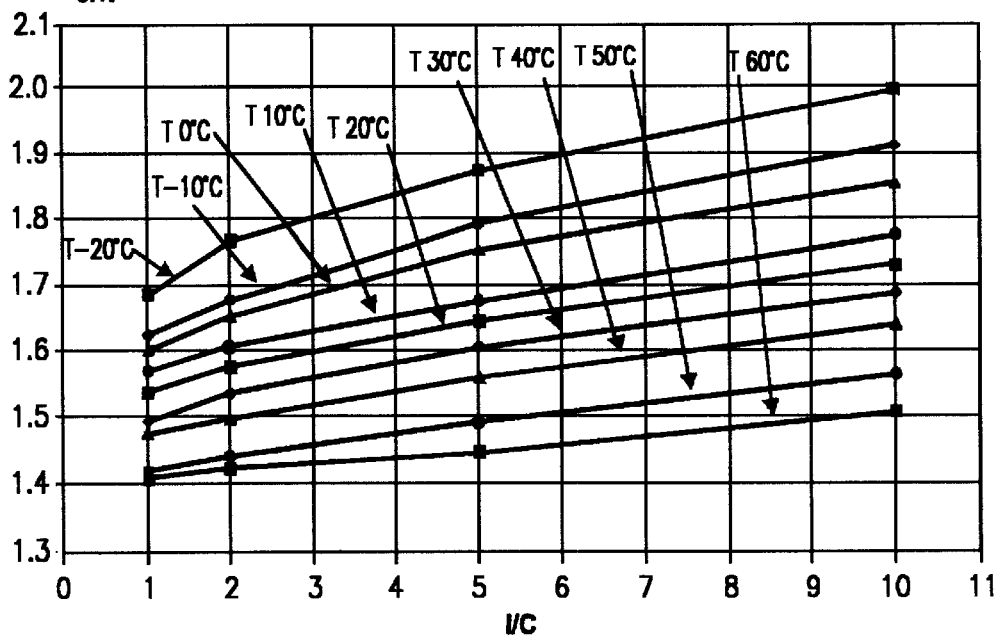
FIG. 2 is a graph of voltage maxima of the cell from FIG. 1 at selected temperatures.

If the measurement described in FIG. 1 is carried out for a large number of different currents at different temperatures and the voltage maxima observed in the process which are correlated with the pressure rise are defined as critical voltage levels associated with these parameters, then this results in the graph shown in FIG. 2. As the charging current rises, the $U_{crit}$ values are shifted toward higher voltage levels. Lower temperatures likewise cause the critical values to be shifted toward higher voltages.

Figure 3:
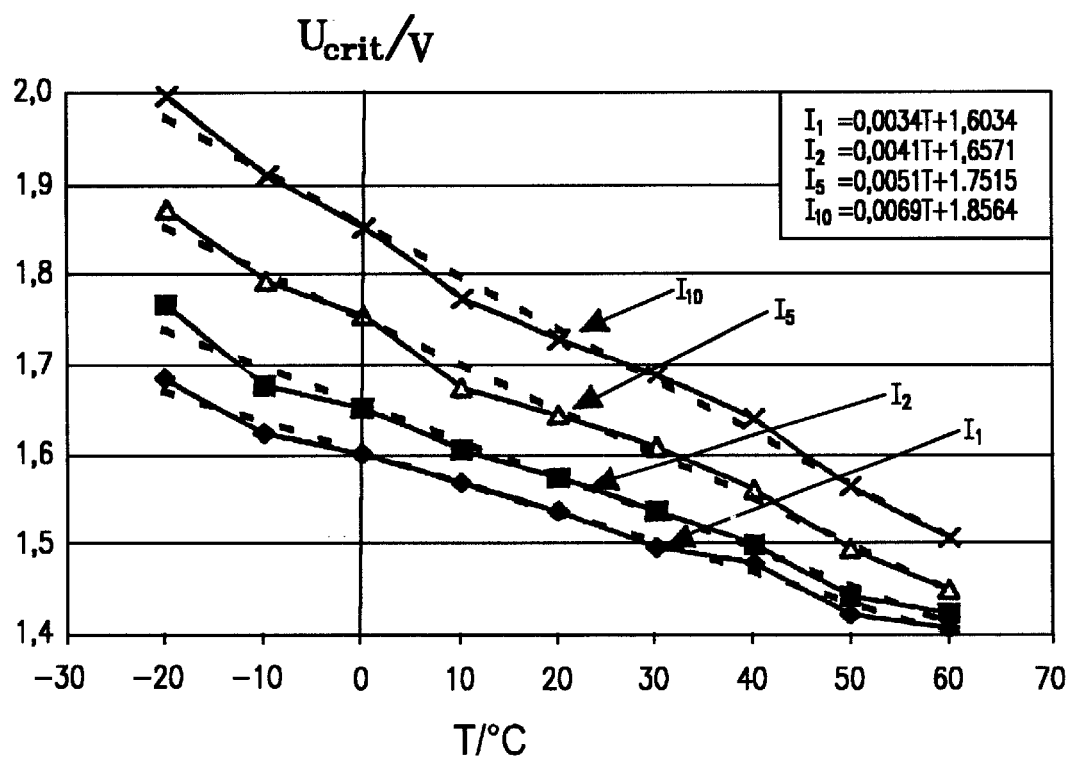
FIG. 3 is a graph showing the relationship between critical voltage and temperature for the cell of FIG. 1 at selected charging currents.
Figure 4:
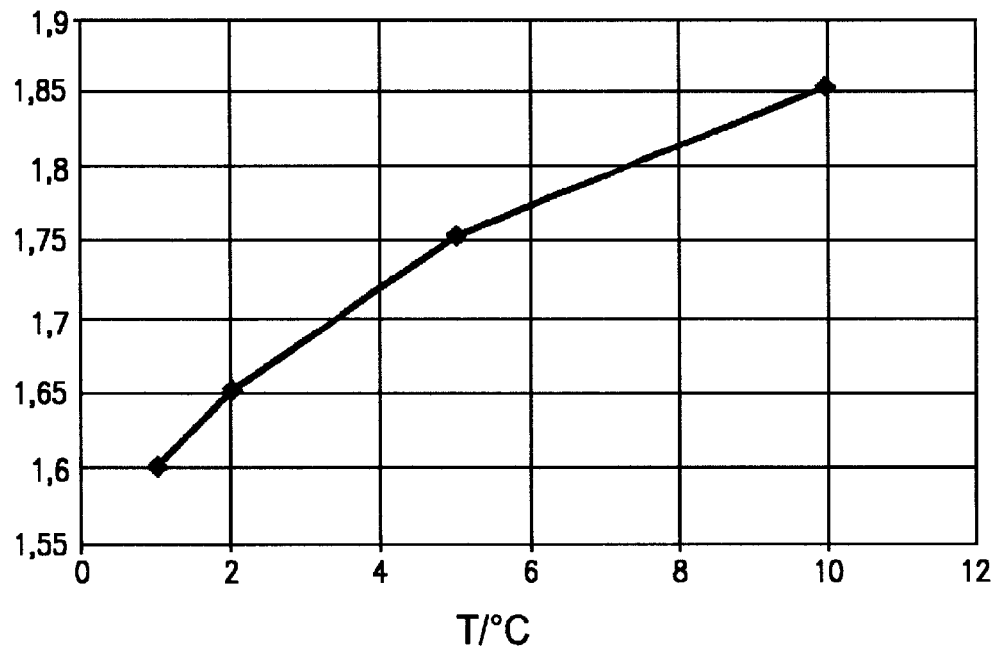
FIG. 4 is a graph of parameter B which is a function of critical voltage and voltage versus charging current.
Figure 5:
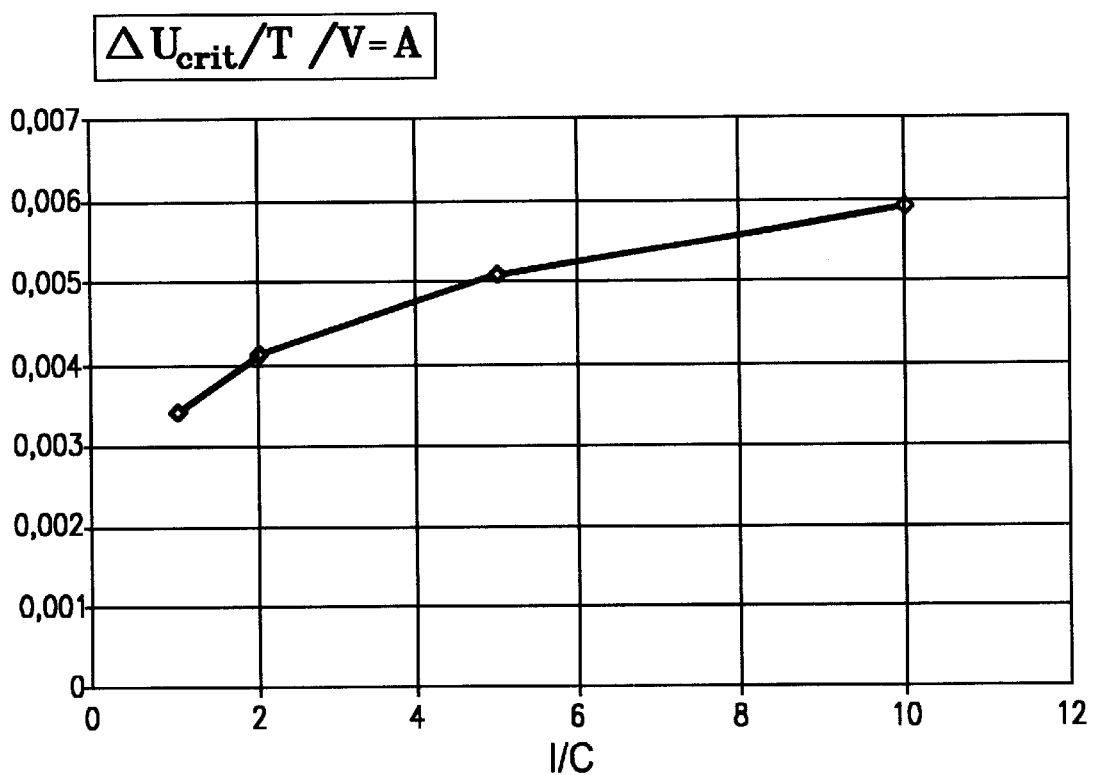
FIG. 5 is a graph of parameter A which is a function of charge in critical voltage and voltage versus charging current.

The relationship, shown in FIG. 3, between the critical voltage $U_{crit}$ and the temperature (using the charging currents in C as a parameter) shows virtually linear profiles, which be be described by a simple mathematical relationship in the form:

$$U_{crit}=A(I)*T+B(I).$$

The linear relationship between $U_{crit}$ and the temperature, which is shown in FIG. 3 for charging currents of 1, 2, 5 and 10 C, but which also applies to charging currents between these values, means that, if the parameters A and B are known, critical charging voltages can be calculated from the above relationship. The critical charging voltage levels can be calculated as reference values in the battery monitoring system, and can be compared with the actual system voltage level. If the actual charging voltage exceeds the critical level, measures are taken to reduce the charging current. The only precondition for this is that the parameter arrays for the value pairs A and B are stored in the battery management system.

Both parameters A and B depend on the charging current (I). The profile of A (rate of rise), wherein $A=\Delta U_{crit}/T/V$, is illustrated in the form of a graph and as a function of the current level I in FIG. 5, and that of B, wherein $B=U_{crit}$ at 0° C./V, is illustrated in the form of a graph in FIG. 4. For practical use, both variables are stored in tabular form, as a parameter table, in a battery management system.

Figure 6:
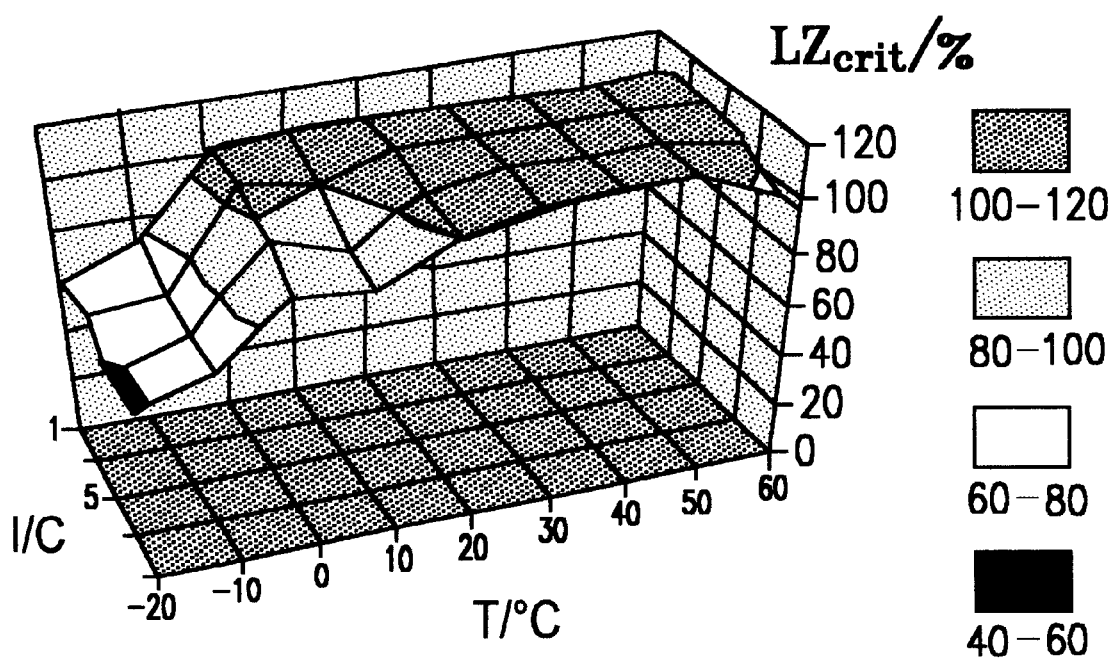
FIG. 6 is a three-dimensional pictogram showing the relationship between critical state of charge, temperature and charging current.

The described relationship between the temperature, charging current and critical voltage can, conversely, also be used to determine the state of charge, since the critical voltage levels are, of course, correlated with a specific critical state of charge ($LZ_{crit}$), as can also be seen in FIG. 1. This critical state of charge $LZ_{crit}$ is also, once again, a function of the parameters temperature (T) and charging current (I). FIG. 6 shows the relationship between the critical state of charge ($LZ_{crit}$), the temperature and the charging current. On reaching a critical charging voltage $U_{crit}$ which is determined as explained above, the state of charge can be deduced from the I and T values on which this graph is based, using the three-dimensional relationship illustrated in FIG. 6. This can be used, for example, to reset a state of charge detection system, which is generally based on charge balancing (Ah counter).

However, the described method is dependent on the criticality criterion. In monitored conditions, this may be done in such a way that, for example, when a vehicle is first brought into use, or at specific intervals defined on a time basis or after specific amounts of charge have been fed in, the rechargeable battery is in general regarded as being virtually discharged. Net charging (positive charging factor) is carried out, by appropriate charging control, until the $U>U_{crit}$ criterion occurs. The state of charge is then determined from the temperature and charging current which are associated with this $U_{crit}$ value, based on the data in FIG. 6. If, for example, voltage criticality occurs at a temperature of 0° C. at a current of 10 C, then an 80% state of charge can be deduced from this. At 20° C. at a current of 10 C, on the other hand, criticality means a state of charge of virtually 100%.

The state of charge is stored in the battery management system and used as a reset value for state of charge monitoring by means of current integration with respect to time. Such state of charge determination can be carried out a fixed time intervals or after feeding in a specific amount of charge.

What is claimed is:

1. A method of controlling charging of a gastight alkaline rechargeable battery comprising:

determining characteristics of critical charging voltage ($U_{crit}$) of the rechargeable battery as a function of charging current (I) at selected temperatures (T);

linearizing the critical charging voltage according to the follow formula:

$$U_{crit}=A(I)33\ T+B(I),$$

wherein $A=\Delta U_{crit}/T/V$ and $B=U_{crit}$ at 0° C./V, and wherein A and B are stored as parameter arrays in a battery management system containing a substantially physically identical rechargeable battery;

calculating an associated critical charging voltage in the substantially physically identical rechargeable battery by measuring temperature and charging current; and comparing associated critical charging voltage information with the critical charging voltage of the rechargeable battery to control the charging of the rechargeable battery.

2. The method as claimed in claim 1, wherein critical states of charge ($LZ_{crit}$), which correspond to the critical charging voltage $U_{crit}$, on the rechargeable battery are determined as a function of charging current (I) and battery temperature (T), and resulting data are stored as parameter arrays in the battery management system, and wherein, during operation of the substantially physically identical rechargeable battery, and on reaching the critical charging voltage ($U_{crit}$) which corresponds to the critical state of charge ($LZ_{crit}$), the value of this critical state of charge ($LZ_{crit}$) is determined, from the measurement of the current (I) and temperature (T), by comparison with the data stored in the parameter arrays.

3. The method as claimed in claim 2, wherein the rechargeable battery is charged to the critical charging voltage ($U_{crit}$) at predetermined times.

4. The method as claimed in claim 2, wherein the rechargeable battery experiences an increase in the state of charge by net charging from any given state of charge, and wherein, on reaching the critical state of charge ($LZ_{crit}$), this state of charge value is stored in the battery management system and, during further operation of the rechargeable battery, this value is used as a reset value for state of charge monitoring by current integration with respect to time.

5. The method as claimed in claim 4, wherein the state of charge is determined at fixed time intervals or after feeding in a specific amount of charge.

* * * * *

UNITED STATES PATENT AND TRADEMARK OFFICE
CERTIFICATE OF CORRECTION

PATENT NO. : 6,392,389 B1
DATED : May 21, 2002
INVENTOR(S) : Uwe Kohler

It is certified that error appears in the above-identified patent and that said Letters Patent is hereby corrected as shown below:

<u>Column 4,</u>
Line 22, delete the formula "$U_{crit} = A(I)33\ T + B(I)$" and insert therefor
-- $U_{crit} = A(I) \times T + B(I)$ --

Signed and Sealed this

Twentieth Day of July, 2004

JON W. DUDAS
*Acting Director of the United States Patent and Trademark Office*